United States Patent
Brett et al.

(10) Patent No.: US 10,362,702 B2
(45) Date of Patent: Jul. 23, 2019

(54) AVIONICS POWER MANAGEMENT PANEL AND DOOR ASSEMBLY

(71) Applicant: GE AVIATION SYSTEMS LIMITED, Cheltenham, Gloucestershire (GB)

(72) Inventors: John Michael Brett, Tewkesbury (GB); Adrian John Hughes, Quedgeley (GB)

(73) Assignee: GE AVIATION SYSTEMS LIMITED, Cheltenham (GB)

(*) Notice: Subject to any disclaimer, the term of this patent is extended or adjusted under 35 U.S.C. 154(b) by 0 days.

(21) Appl. No.: 15/877,412

(22) Filed: Jan. 23, 2018

(65) Prior Publication Data
US 2018/0242468 A1    Aug. 23, 2018

(30) Foreign Application Priority Data
Feb. 20, 2017   (GB) .................................. 1702710.3

(51) Int. Cl.
| H05K 7/14 | (2006.01) |
| H05K 5/02 | (2006.01) |
| H02B 1/32 | (2006.01) |
| H02B 1/044 | (2006.01) |
| H02B 1/38 | (2006.01) |

(52) U.S. Cl.
CPC ......... *H05K 7/1432* (2013.01); *H05K 5/0239* (2013.01); *H05K 7/1412* (2013.01); *B64D 2221/00* (2013.01); *H02B 1/044* (2013.01); *H02B 1/32* (2013.01); *H02B 1/38* (2013.01)

(58) Field of Classification Search
CPC .. H05K 5/0239; H05K 7/1412; H05K 7/1432; B64D 2221/00

USPC ................................. 361/600–678, 752–759
See application file for complete search history.

(56) References Cited

U.S. PATENT DOCUMENTS

| 4,728,914 | A | * | 3/1988 | Morris | ................. | H01H 71/123 |
| | | | | | | 335/6 |
| 5,202,538 | A | | 4/1993 | Skirpan | | |
| 5,786,995 | A | | 7/1998 | Coleman | | |
| 6,580,041 | B1 | | 6/2003 | Ransopher | | |
| 7,724,516 | B2 | * | 5/2010 | Harder | ................... | H05K 7/202 |
| | | | | | | 211/41.17 |
| 7,959,453 | B2 | | 6/2011 | Guering | | |

(Continued)

FOREIGN PATENT DOCUMENTS

| CN | 201718128 U | 1/2011 |
| CN | 204130936 U | 1/2015 |

(Continued)

OTHER PUBLICATIONS

Bret, J., et al., Avionics power management panel and door assembly, GE Co-pending Application No. 1702709.5, filed on Feb. 20, 2017.

(Continued)

*Primary Examiner* — Zachary Pape
(74) *Attorney, Agent, or Firm* — McGarry Bair PC (57) ABSTRACT

An avionics power management panel and door assembly where the panel includes a cabinet including a set of walls at least partially defining an interior with an open face and door assembly includes a central panel a front panel that includes a set of rows with apertures formed between two adjacent rows and where the set of rows have a crimped profile.

17 Claims, 13 Drawing Sheets

(56)     References Cited

U.S. PATENT DOCUMENTS

| | | | |
|---|---|---|---|
| 8,094,436 B2 | 1/2012 | Mills et al. | |
| 8,559,149 B2 | 10/2013 | Wavering et al. | |
| 8,749,956 B2 * | 6/2014 | Guering | H02B 1/044 |
| | | | 307/18 |
| 8,753,129 B2 | 6/2014 | Worley | |
| 8,922,978 B2 | 12/2014 | Brett | |
| 9,312,674 B2 * | 4/2016 | Mills | H01H 9/18 |
| 2011/0110049 A1 | 5/2011 | Lehtola et al. | |
| 2015/0076904 A1 | 3/2015 | Mills et al. | |
| 2016/0288992 A1 * | 10/2016 | Jorgensen | B65D 90/006 |
| 2018/0241182 A1 * | 8/2018 | Brett | H02B 1/34 |

FOREIGN PATENT DOCUMENTS

| | | |
|---|---|---|
| CN | 204391544 U | 6/2015 |
| DE | 197 25 135 A1 | 1/1998 |
| DE | 200 01 759 U1 | 5/2000 |
| EP | 1 037 348 A1 | 9/2000 |

OTHER PUBLICATIONS

Combined Search and Examination Report issued in connection with corresponding GB Application No. 1702710.3 dated Aug. 21, 2017.

* cited by examiner

AVIONICS POWER MANAGEMENT PANEL AND DOOR ASSEMBLY

BACKGROUND OF THE INVENTION

Contemporary aircrafts use avionics in order to control the various equipment and operations for flying the aircraft. The avionics can include electronic components carried by a circuit board or connected to circuit breakers. The circuit boards or circuit breakers can be stored in the avionics chassis, which performs several beneficial functions, some of which are: dissipating the heat generated by the avionics or electronic components, and protecting the avionics from environmental exposure.

BRIEF DESCRIPTION OF THE INVENTION

In one aspect, the present disclosure relates to an avionics power management panel includes a cabinet including a set of walls at least partially defining an interior with an open face and at least one door assembly moveably mounted to the cabinet and moveable between an opened position, where the interior is accessible, and a closed position where the door assembly closes the open face and having a front panel that includes a set of rows with apertures formed between two adjacent rows and where the set of rows have a crimped profile with a ridge extending towards a front surface of the door assembly wherein the door assembly is configured to support circuit breakers, printed circuit boards, or electrical relays.

In another aspect, the present disclosure relates to a door assembly for an avionics power management panel including a central section that includes a set of rows with apertures formed between two adjacent rows and where the set of rows have a crimped profile with a ridge extending towards a front surface of the door assembly, a frame at least partially surrounding the central section, and a printed circuit board mounted to the door assembly.

In yet another aspect, the present disclosure relates to door assembly for an avionics power management panel includes a central panel a front panel that includes a set of rows with apertures formed between two adjacent rows and where the set of rows have a crimped profile with a ridge extending a length towards a front surface of the door assembly and at least one plug in circuit breaker mounted within an aperture of the central panel and wherein the at least one plug in circuit breaker is contained within the length defined by the crimped profile.

DETAILED DESCRIPTION

On aircraft the electrical power distribution system services various consumer loads around the aircraft. Power management panels are used to route power from the electrical power source to the electrical loads. On modern aircraft the increased number of services demands an increase in the number of components and circuits. The increase in required components and circuits leads to increased wiring for the specific loads, thereby increasing both cost and weight. As such, power management panels can be relatively large, weighing up to 150 lbs, for which the strength to weight characteristics of the assemblies is a critical aspect in the performance of the electrical system within the demanding environment. Aspects of the disclosure describe a beneficial door assembly.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order, and relative sizes reflected in the drawings attached hereto can vary.

Figure 1:
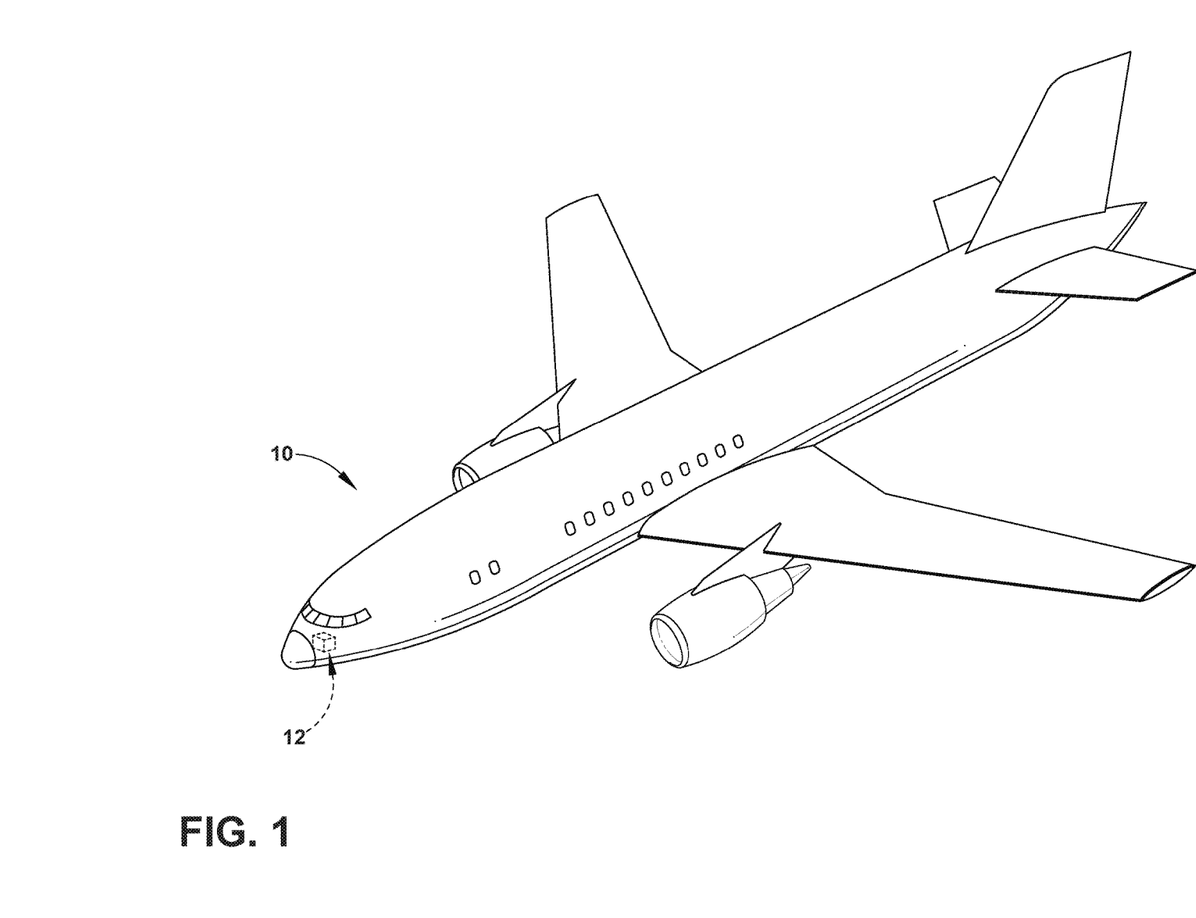
FIG. 1 is a perspective view of an aircraft having an avionics chassis in accordance with various aspects described herein.

FIG. 1 schematically illustrates an aircraft 10 with an on-board avionics chassis assembly 12 (shown in dashed line), which can include a power management panel. The avionics chassis assembly 12 can house a variety of avionics elements and protect them against contaminants, vibrations, and the like and aids in dissipating the heat generated by the avionics or electronic components. It will be understood that the avionics chassis assembly 12 can be located anywhere within the aircraft 10, not just the nose as illustrated. For example, there can be any number of power management panels distributing power around the aircraft 10. While illustrated in a commercial airliner, the avionics chassis assembly 12 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles. Any implementation has its own space constraints and power requirements. As such, the design of the particular aspects of the avionics chassis assembly 12 as described herein can be tailored to suit specific installation requirements of the implementation.

Figure 2:
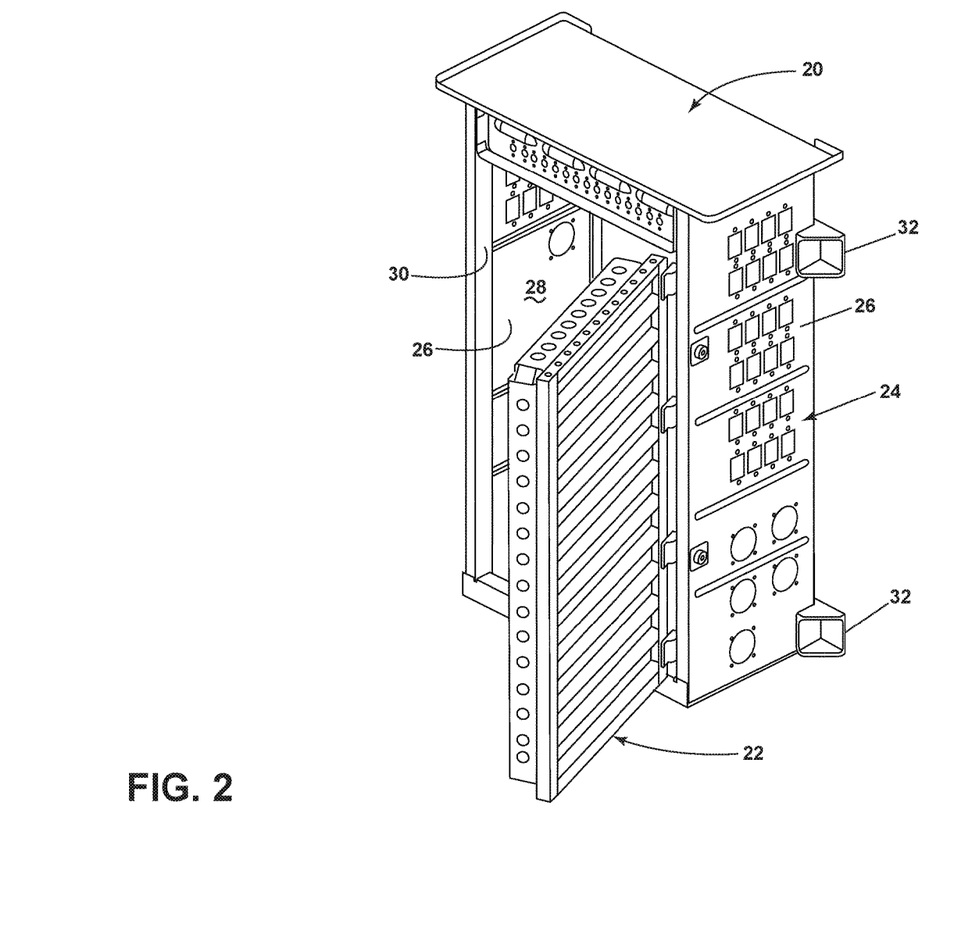
FIG. 2 is a perspective view of an exemplary avionics chassis that can be utilized in the aircraft of FIG. 1, in accordance with various aspects described herein.

FIG. 2 illustrates an exemplary power management panel assembly 20 with a single door assembly 22 that can be utilized in the aircraft 10 of FIG. 1. The power management panel assembly 20 includes a cabinet or housing 24 including a set of walls 26 at least partially defining an interior 28 with an open face 30. A set of mounting feet 32 can extend from the housing 24 to facilitate mounting the housing 24 to the aircraft 10 by means of bolts or other conventional fasteners. Further, the mounting feet 32, can function as an electrical ground to ground the housing 24 to the frame of the aircraft 10. While mounting feet 32 are shown in this example, the power management panel assembly 20 can be used with many types of attachment mechanism.

Figure 3:
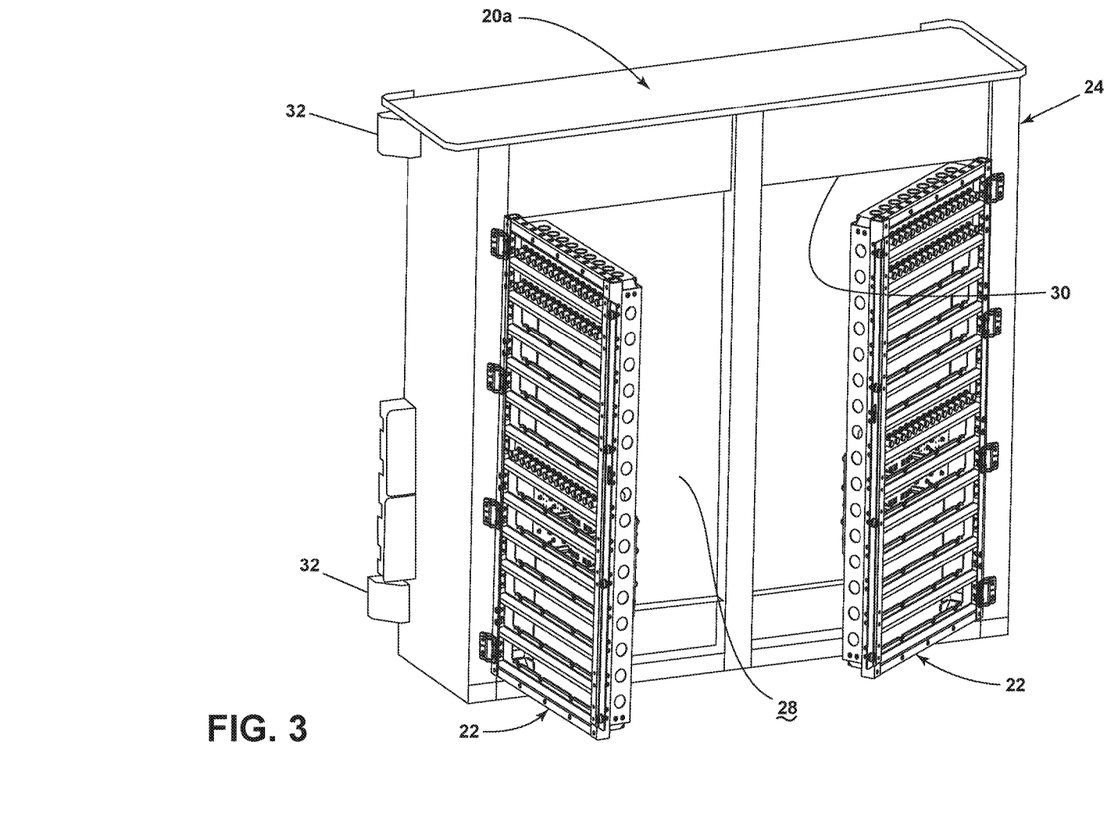
FIG. 3 is a perspective view of another exemplary avionics chassis that can be utilized in the aircraft of FIG. 1, in accordance with various aspects described herein.

FIG. 3 is a perspective view of another exemplary power management panel assembly 20a. The power management panel assembly 20a of FIG. 3 can be substantially similar to the power management panel assembly 20 of FIG. 2. As such, the same numerals will be used to described equivalent elements and the discussion will be limited to differences between the power management panel assemblies. The main difference between the power management panel assemblies 20, 20a is that the power management panel assembly 20a of FIG. 3 includes two door assemblies 22. In the illustrated example, the door assemblies 22 include a right hand and left hand hinged door assemblies 22. The door assembly 22 includes a common design with the parts being handed for a left or right hinge location.

Figure 4:
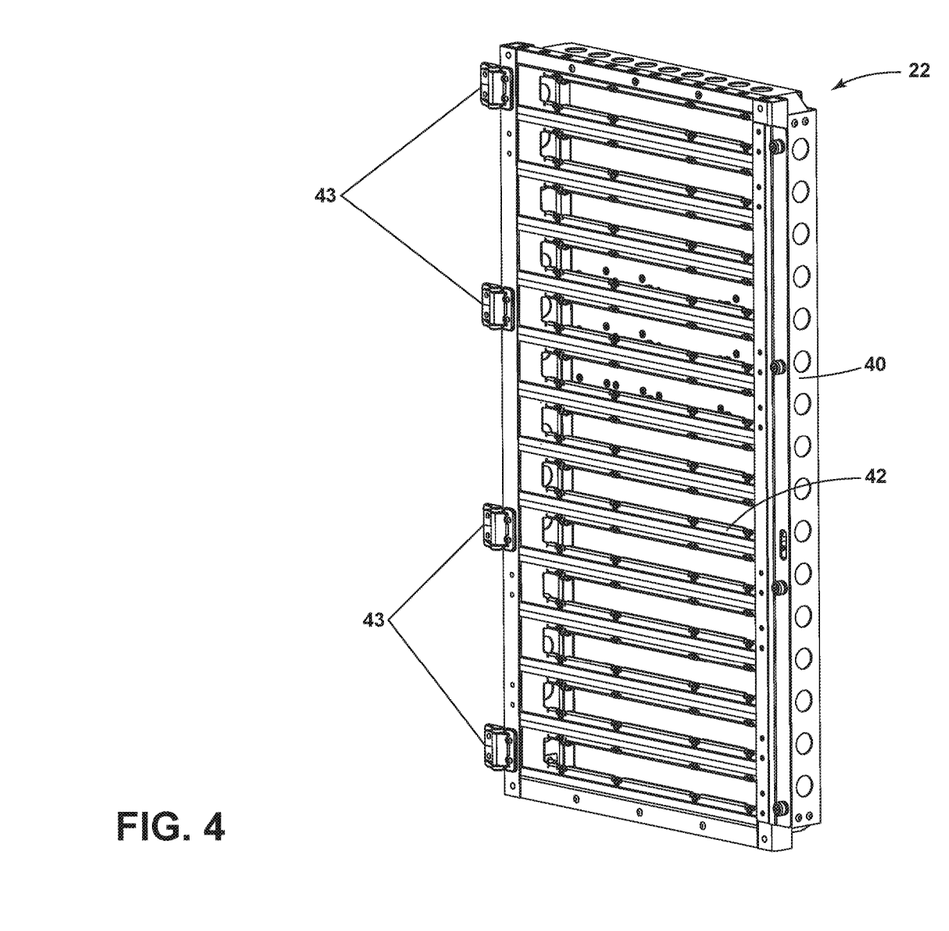
FIG. 4 is a perspective view of a door assembly that can be utilized with an avionics chassis including those of FIGS. 2 and 3 in accordance with various aspects described herein.

Regardless of the specifics of the housing 24 for the power management panel assembly 20, 20a, the door assembly 22 can include a frame 40 and a center section, center panel, or front panel 42 as illustrated in FIG. 4. The door assembly 22 can be moveably mounted to the housing 24. For example, a set of hinges 43 can be included on the door assembly 22 such that the door assembly 22 is pivotably mounted to the housing 24 of FIG. 2 or 3. The door assembly 22 is moveable between an opened position, where the interior 28 of the power management panel assembly 20, 20a is accessible, and a closed position where the door assembly 22 closes the open face 30 and the interior 28 of the power management panel assembly 20, 20a is inaccessible.

Figure 5A:
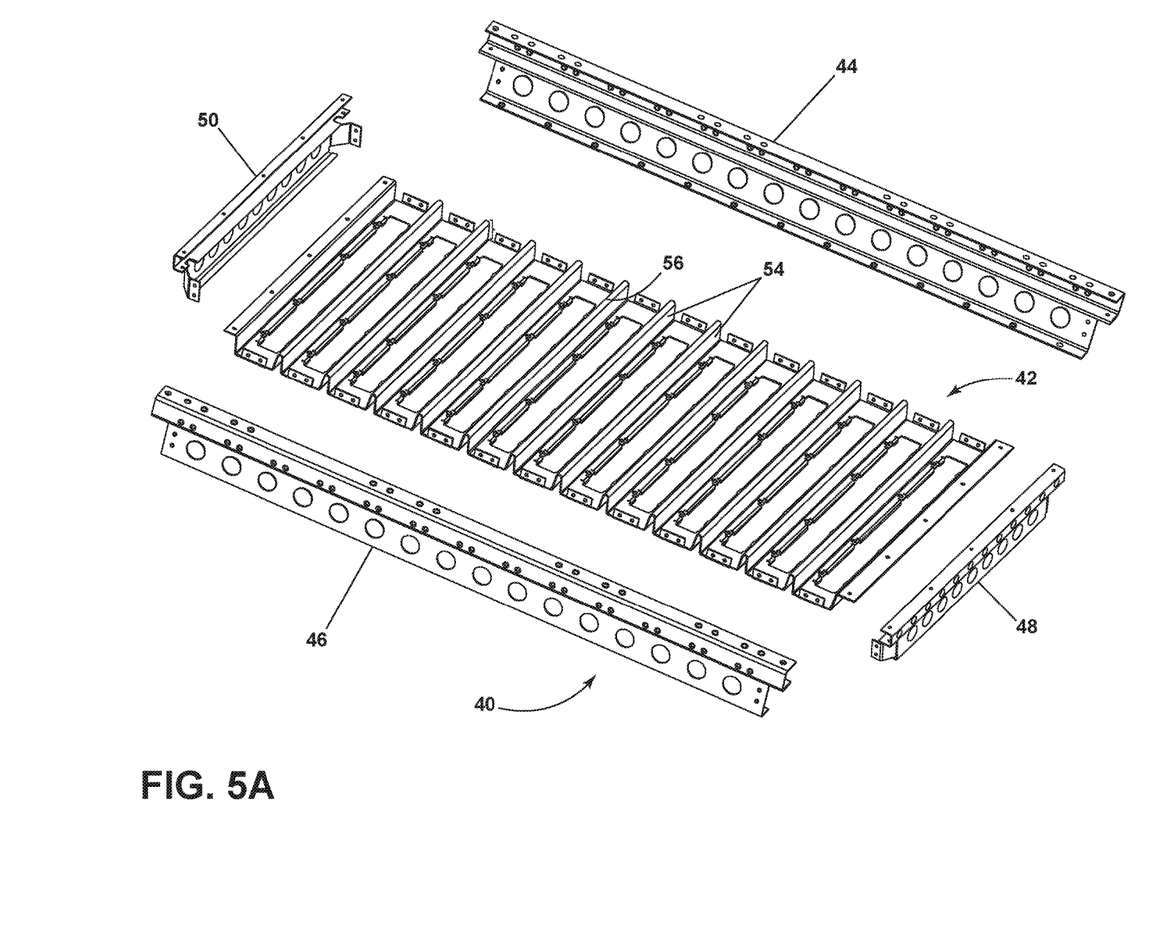
FIG. 5A is an exploded perspective view of an exemplary frame for the door assembly of FIG. 4.

FIG. 5A is an exploded view showing the frame 40 including opposing side sections including a first side section 44 and a second side section 46, a top section 48, and a bottom section 50. It is contemplated that the frame 40 can be formed in any suitable manner including that each of the sections 44, 46, 48, and 50 forming the frame 40 can have a common extrusion profile as described in the concurrently-filed, commonly-owned GB Patent Application Serial No. 1702710.3, filed Feb. 20, 2017, entitled "AVIONICS POWER MANAGEMENT PANEL AND DOOR ASSEMBLY,", which is incorporated herein by reference in its entirety. In the illustrated example, the frame 40 has been illustrated as stamped aluminum pieces, which can be formed by bending, that can be fastened together in any suitable manner. In the illustrated example, the sections 44, 46, 48, and 50 are secured by fastening the sections 44, 46, 48, and 50 together at the corners via fasteners such as screws or rivets.

Figure 5B:
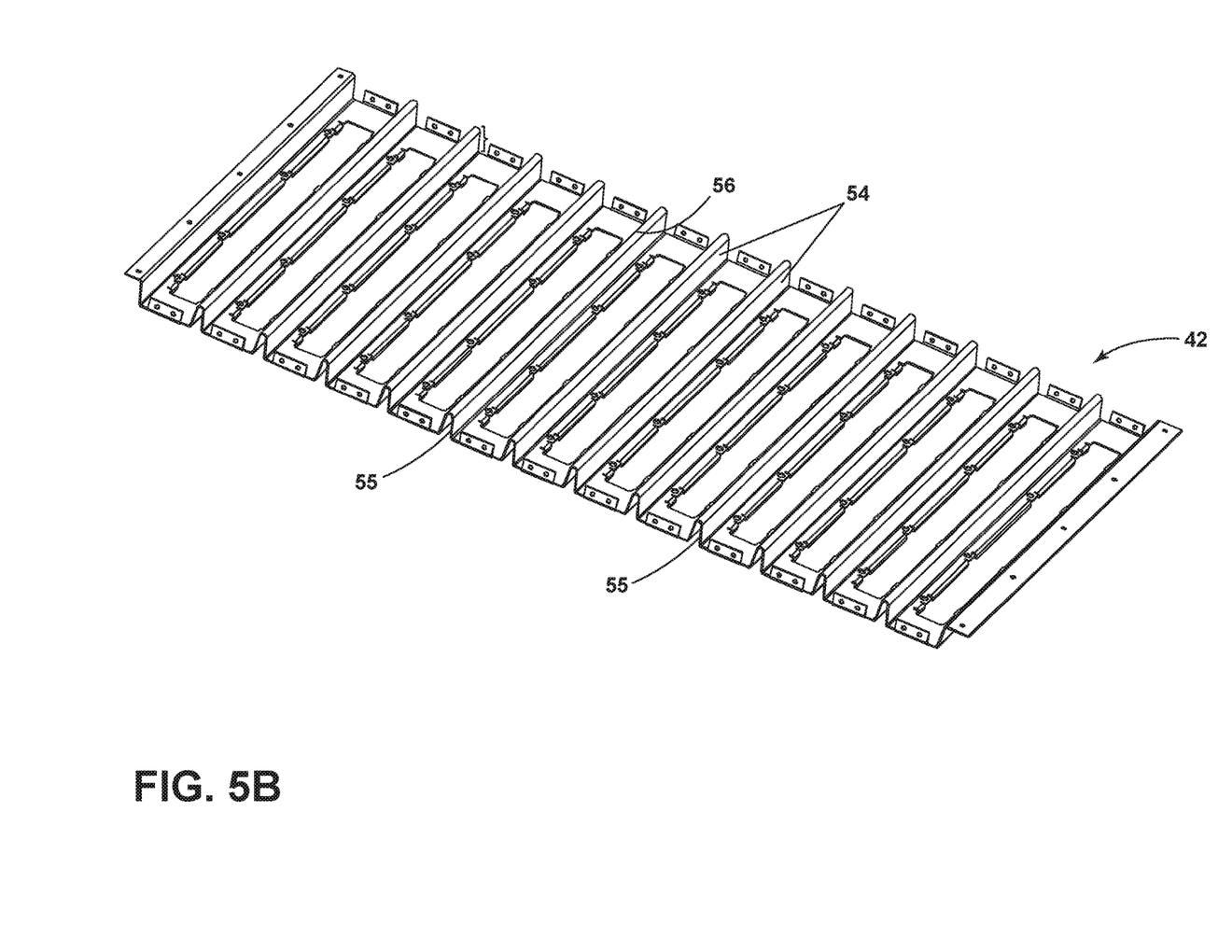
FIG. 5B is a perspective view of an exemplary front panel for the door assembly of FIG. 4.
Figure 6:
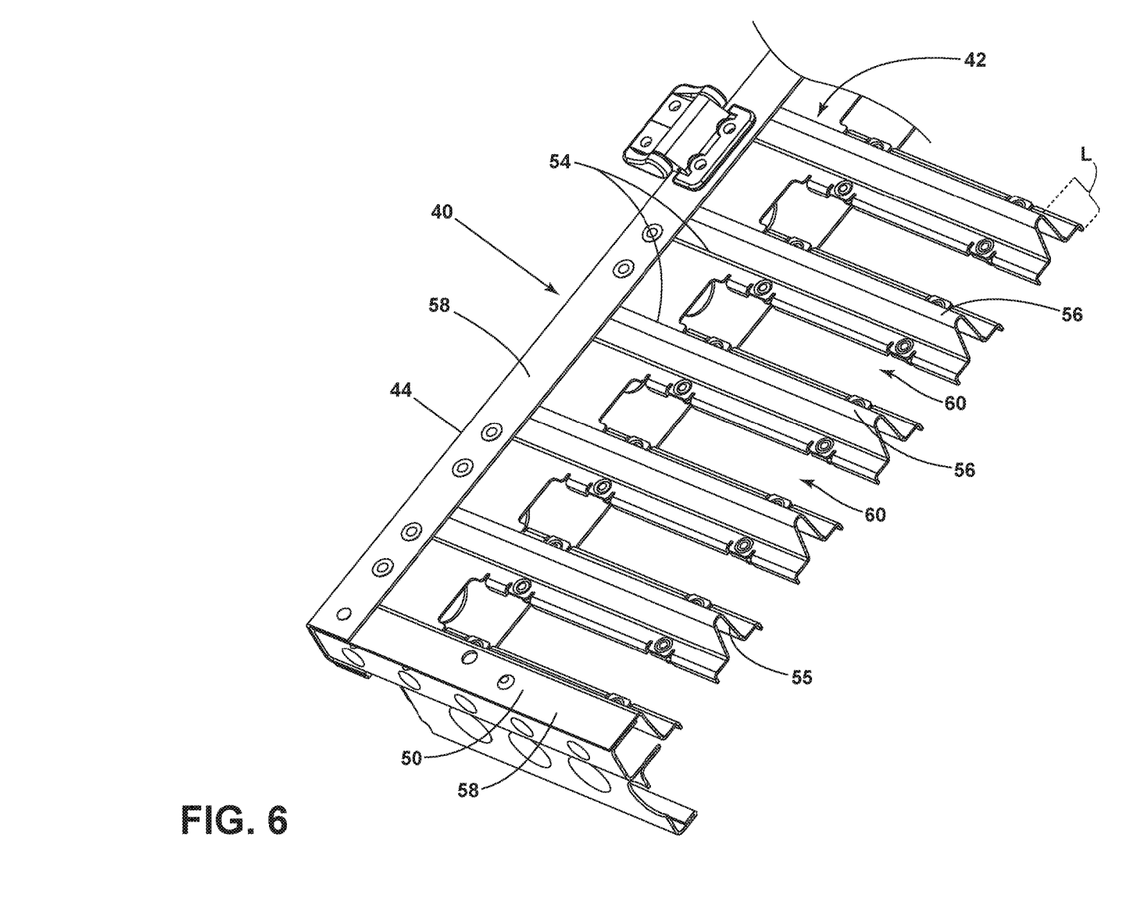
FIG. 6 is a perspective view of a portion of the door assembly of FIG. 4.

FIG. 5B illustrates an enlarged view of the front panel 42 without the sections 44, 46, 48, and 50. A set of rows 54 is included in the center portion forming the front panel 42. In the illustrated example, the set of rows 54 are defined by a crimped profile 55 that includes a ridge 56. As illustrated in FIG. 6, the ridge 56 can extend a length (L) towards a front surface 58 of the door assembly 22. The ridge 56 does not extend past the frame 40 when the front panel 42 is located within the frame 40, otherwise the elongated ridge 56 can impact the footprint of the door and the overall size of the panel assembly. It will be understood that the ridge 56 could alternatively extend beyond the frame 40 or extend to a lesser length L than illustrated.

Apertures 60 are located between two adjacent rows 54. The apertures 60 can be formed in any suitable size or shape and are illustrated as being able to accommodate any combination of circuit breakers, printed circuit boards, and electrical relays in non-limiting examples.

While the front panel 42 can be formed in any suitable manner, it is contemplated that the front panel 42 can be formed from a sheet of aluminum, that the crimped profile 55 can be formed in the aluminum sheet, and that the apertures 60 can be formed by stamping out portions of the aluminum sheet.

Figure 7:
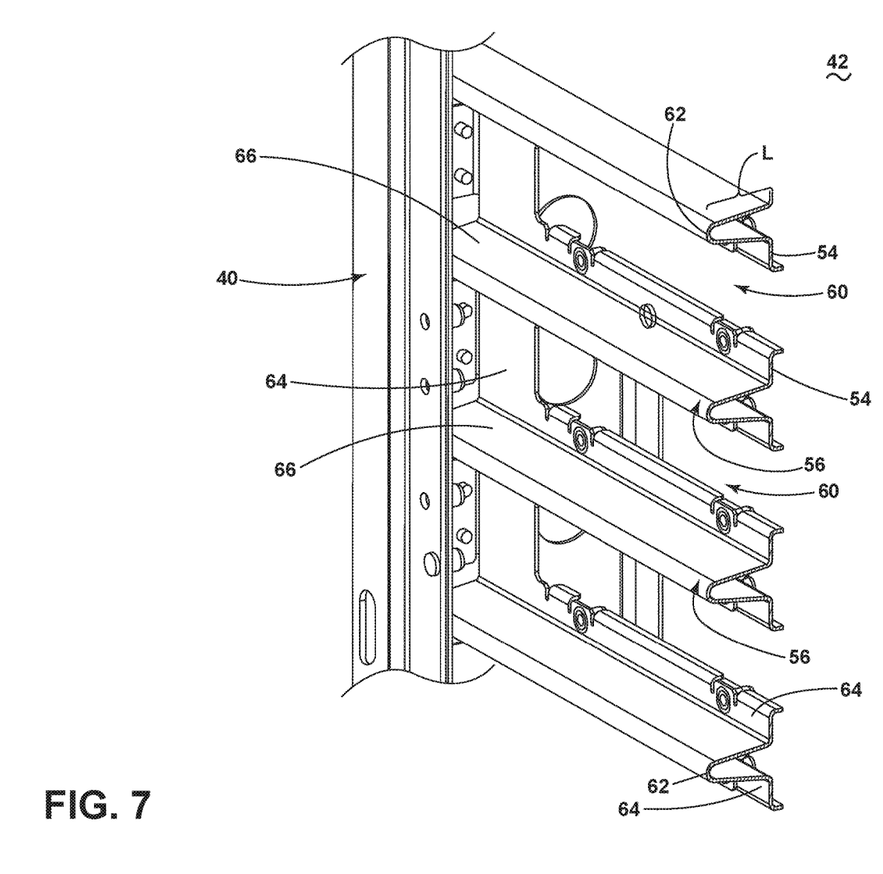
FIG. 7 is a cut perspective view of a portion of the frame shown in FIG. 6.

Referring to FIG. 7, showing a portion of the center section of the front panel 42 of FIG. 4, the crimped profile 55 can be considered a saw-tooth profile that is repeated across each row 54 of the front panel 42. The ridge 56 is v-shaped having a rounded end 62. The v-shaped ridge 56 terminates in a flat panel portion 64, opposite of the rounded end 62, that extends between adjacent rows 54 and in which the aperture 60 is formed. The ridge 56 further includes a downwardly angled upper surface 66 extending between the rounded end 62 and the flat panel portions 64. The downwardly angled upper surfaces 66 allow for moisture to run off of the ridges 56 and prevents collection of fluids along the front panel 42 that can otherwise have an adverse effect on the operation of the electrical components mounted to the door assembly 22 or the electronics chassis 12.

Figure 8:
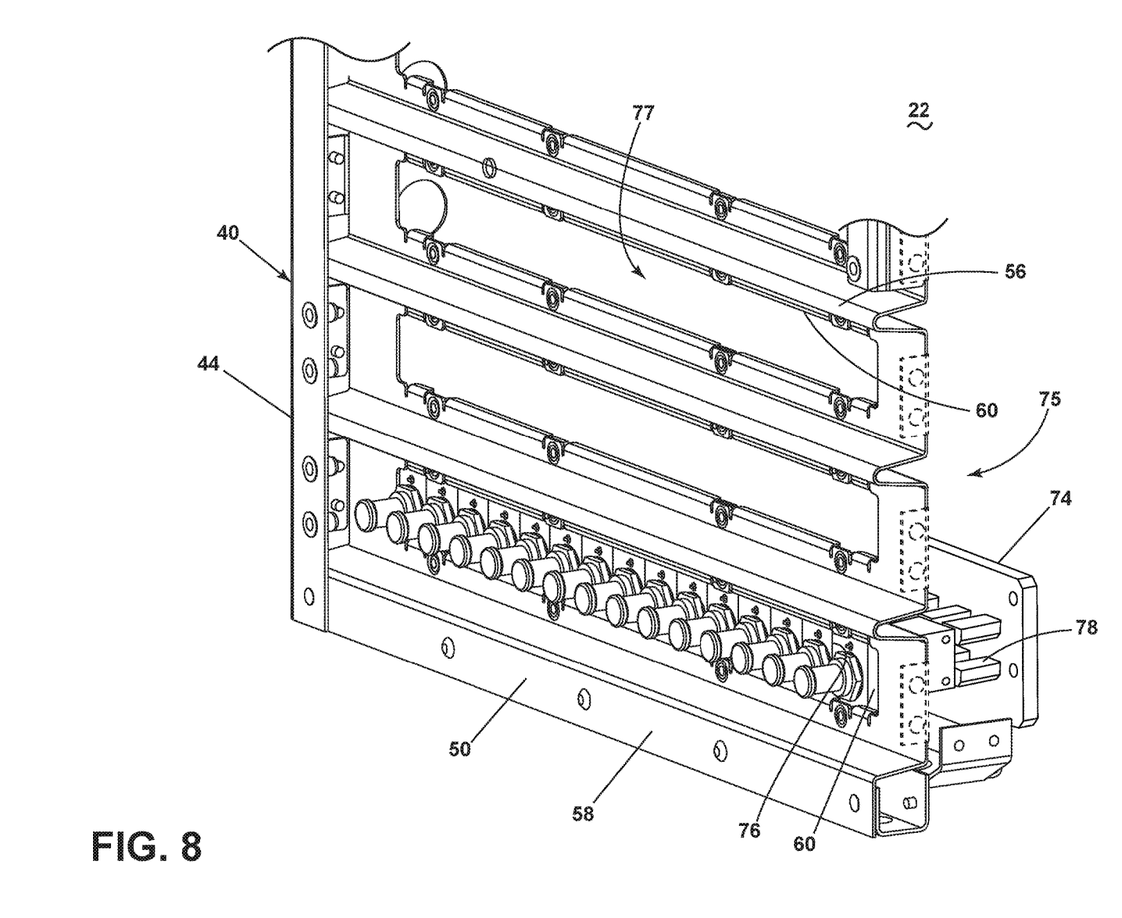
FIG. 8 is a perspective view of the door assembly of FIG. 4 with circuit breakers and printed circuit boards mounted thereto.

It is contemplated that the front panel 42 can be formed to span at least one of a length or a width of the frame 40 and can be mounted to the frame 40 in any suitable manner. Referring to FIG. 8, the front panel 42 positions into the frame 40 as and the sections 44, 46, 48, and 50 of the frame 40 can secure together via fasteners (not shown). A printed circuit board 74 having additional components (not shown) is mounted to a rear-side surface 75 of the frame 40. The printed circuit board 74 can be mounted to the frame 40 in any suitable manner including via any suitable set of fasteners. A set of plug-in circuit breakers 76 can mount to a front side 77 of the front panel 42 and passing through the aperture 60. The set of plug in circuit breakers 76 are press fit into sockets 78 within the printed circuit board 74. Once assembled, it is contemplated that the door assembly 22 as described herein can support weight in excess of 11.34 kg (25 lbs). During operation of the aircraft, the door assembly 22 could see mechanical vibrations imposing a magnification factor of ten times such a weight.

Figure 9:
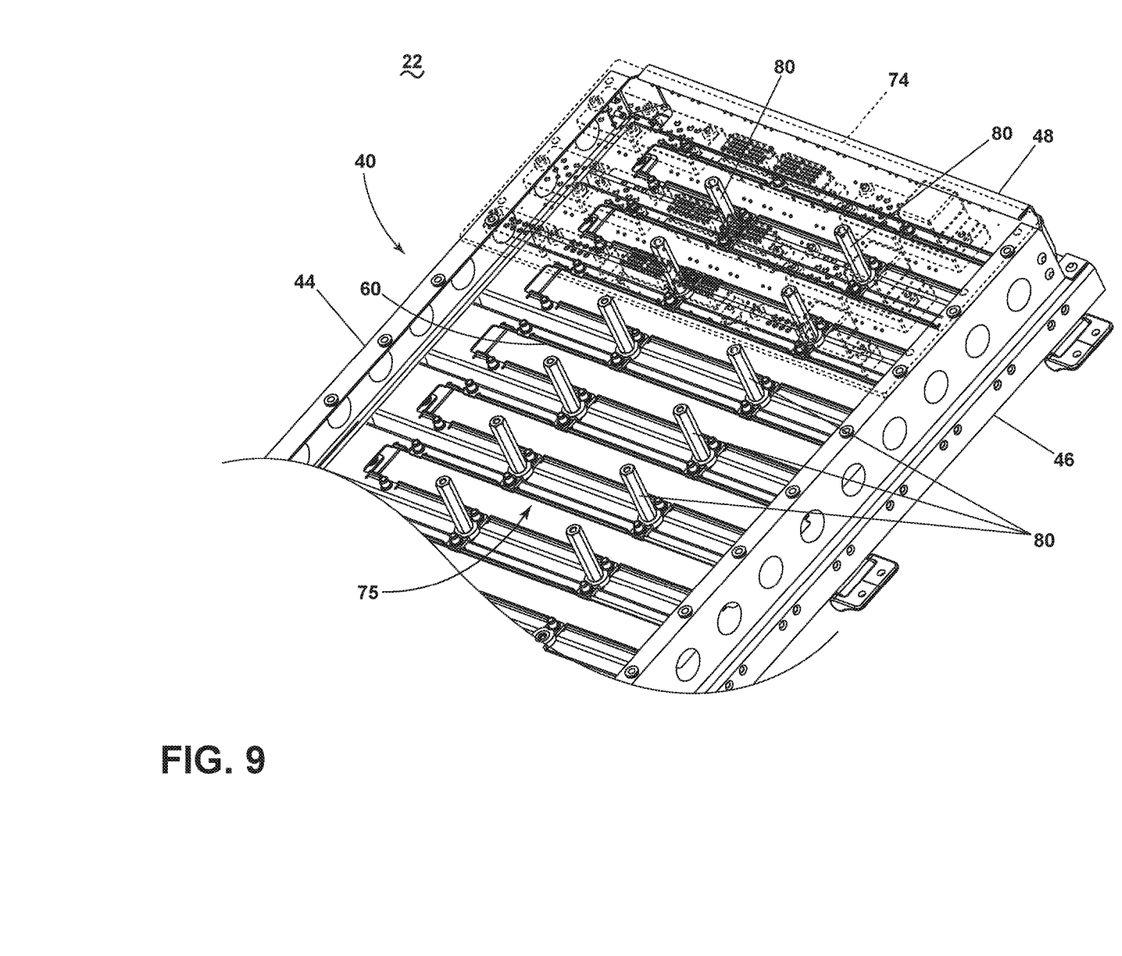
FIG. 9 is a perspective view of the door assembly of FIG. 4 with a printed circuit board attached and shown in dashed line.
Figure 10:
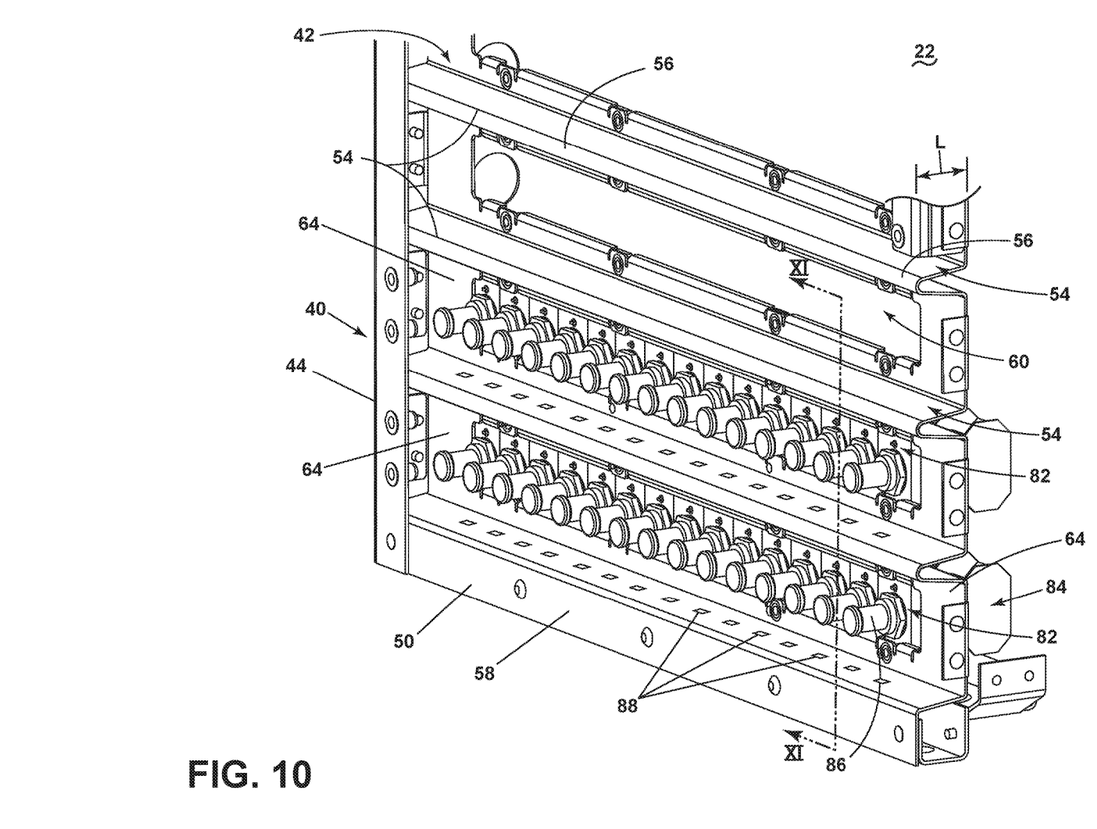
FIG. 10 is a perspective view of the door assembly of FIG. 4 with circuit breakers mounted thereto.

It will be understood that the door assembly 22 along with the printed circuit board(s) 74 are configurable to support a myriad of alternative combinations of electronics components. Additionally, as illustrated in FIG. 9, the printed circuit board 74, shown in dashed line, can be designed to cover and number of rows of the door assembly 22. The external edges of the printed circuit board 74 are supported by and fastened to the rear surface 75 of the frame 40. Further, a set of pillar spacers 80 can be included in the door assembly 22 to support the printed circuit board(s) 74. Referring now to FIG. 10, a set of plates 90 (FIG. 11) that are coupled to the front panel 42 position behind a front face 82 of a circuit breaker 84. The front face 82 is mounted between two adjacent rows 54. In this manner, the front face 82 is braced against the rows 54. The front faces 82 can be secured to the rows 54 in any suitable manner, such as mounting with fasteners, in one non-limiting example. The pillar 80 (FIG. 9) can be suspended from the front faces 82 and allows the pillar 80 to support the printed circuit board 74 adjacent a corresponding aperture 60 as shown in FIG. 9.

Still referring to FIG. 10, the circuit breakers 84 include a protrusion 86 mounted to the door assembly 22. The downwardly-angled upper surface 66 (FIG. 7) is configured for labelling or indicia 88. The indicia 88 can be specific to each door 22 configuration and can be located on each of the rows 54 along the height or width of the door assembly 22.

While only a single circuit board 74 has been shown in the illustrative examples, it will be understood that the door assembly 22 can support any combination of circuit breakers 84, printed circuit boards 74, electrical relays, or similar electrical components. In one particular example, five printed circuit boards 74 can mount to the door assembly 22.

Figure 11:
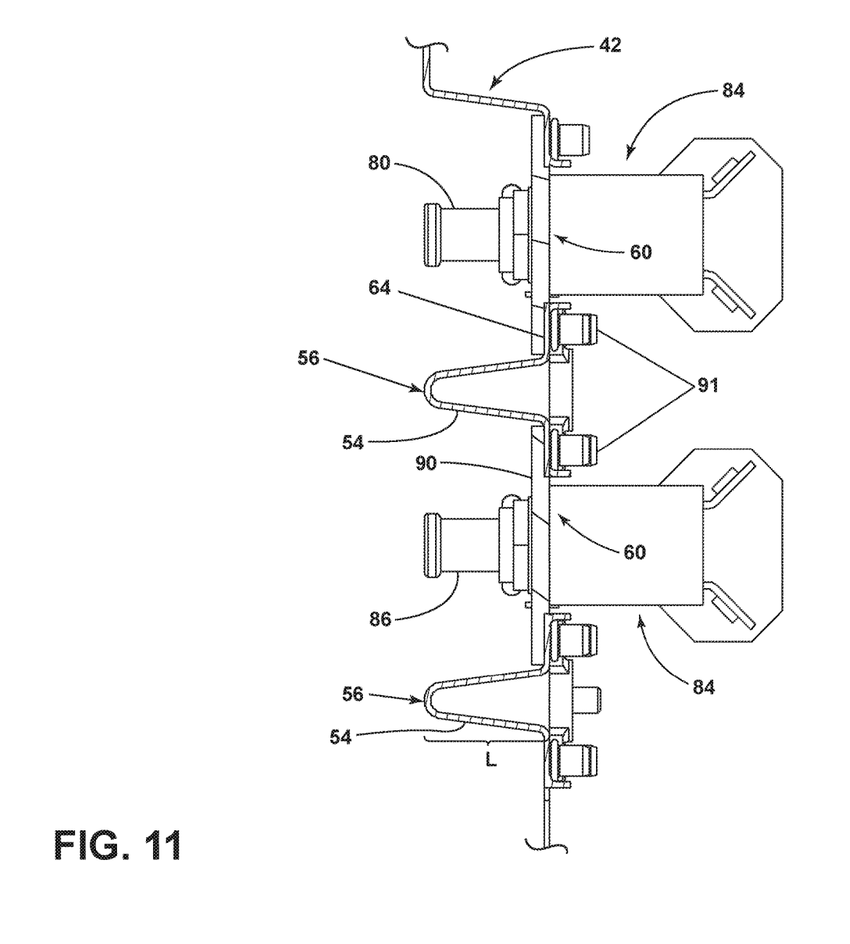
FIG. 11 is a cross-sectional view of a portion of the door assembly of FIG. 10 taken along section XI-XI.

FIG. 11 is a cross-sectional view illustrates a set of circuit breakers 84 extending through the aperture 60 and can secure to the flat panel portion 64 of the front panel 42 via fasteners 91. A cover plate 90 can cover the front faces 82 of the circuit breakers 84 (FIG. 10). The cover plate 90 is multi-functional as it ties together the ridge 56 to prevent collapsing and adds additional strength to the frame 40 (FIG. 4). Additionally, the plates 90 provides for a mounting position for the support pillars 80 (FIG. 9). In the view shown, the wired circuit breakers 84 fit to the plate 90 and secure to the flat panel portion 64 by the fasteners 91. The ridges 56 of the front panel 42 provide physical protection for the set of circuit breakers 84. More specifically, protrusions 86 extending from the set of circuit breakers 84 are contained within the length (L) of the ridges 56 of the front panel 42. Regardless of whether the circuit breakers are active and or tripped state, the circuit breakers 84 are physically protected. Furthermore, the ridges 56 can minimize or prevent unwanted tripping of the circuit breakers 84.

Figure 12:
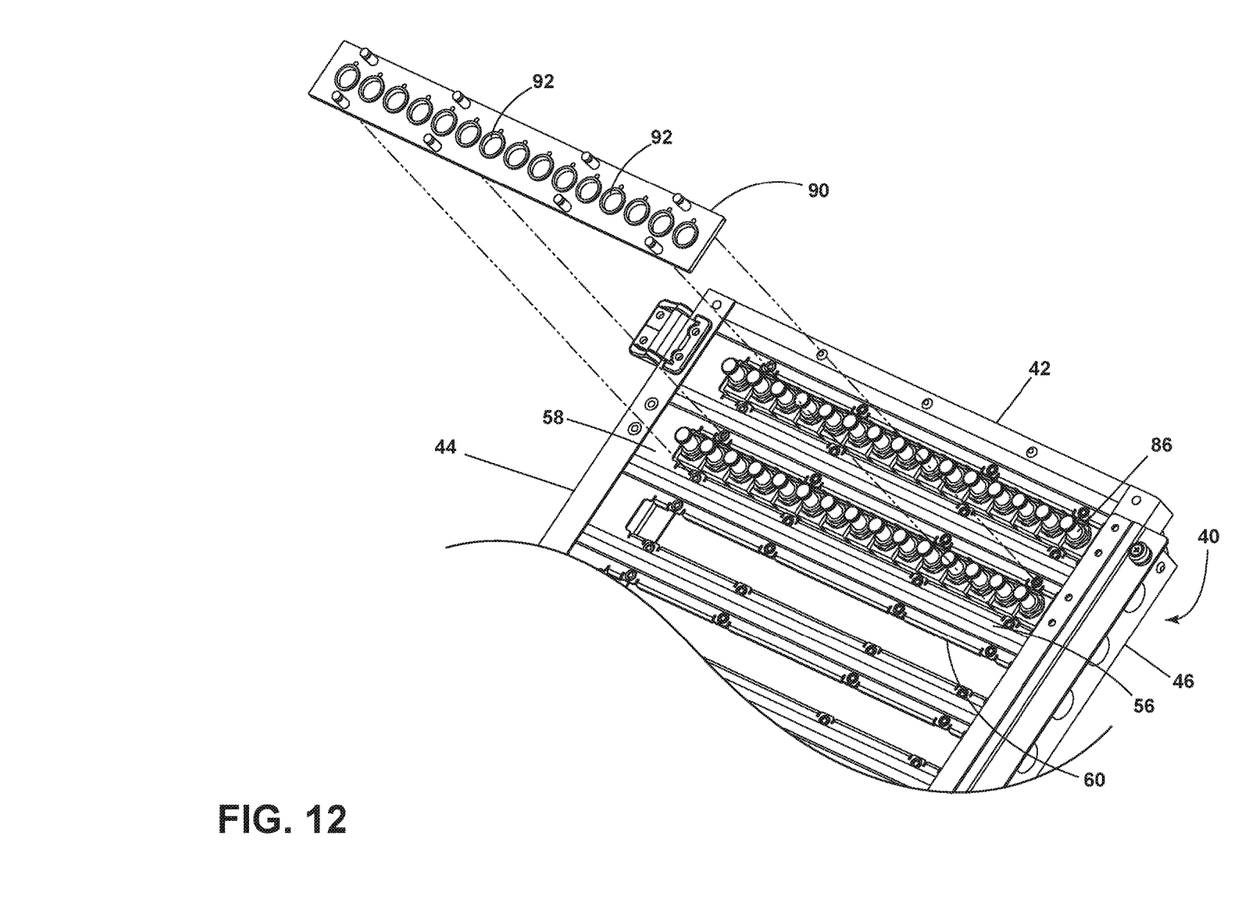
FIG. 12 is a perspective view of the door assembly of FIG. 10 with a cover plate exploded therefrom.

FIG. 12 illustrates the cover plate 90 with a set of openings 92 can be mounted to the front surface 58 of the door assembly 22. The cover plate 90 is configured to retain the at least one plug in circuit breaker 84 during operation. The cover plate 90 also aids in frustrating foreign debris from entering the housing 24. It will be understood that the cover plate 90 can have any suitable arrangement including, but not limited to, that the cover plate 90 inserts between two rows 54.

With the continual upgrading of aircrafts, there is a requirement for an increase in the number of components fitted into the exemplary power management panel assembly 20, 20a. The aspects of the present disclosure allow for a number of additional electrical components to be supported on the door assembly 22. Such components would have previously been mounted onto the internal panel walls of power management panel assembly 20, 20a, interconnecting via wiring looms as required. The aspects of the present disclosure allow for mounting electrical components onto the door assembly 22 with printed circuit boards 74 used to provide the electrical interface, thus removing the need for the wiring looms. The door assembly 22 design and component interconnection arrangement increases the functionality of the avionics chassis assembly. For example the doors 22 provide structural, configurable, and maintainable support. The ability to locate a number of electrical assemblies onto the door 22 closer to the electrical loads being serviced leads to a reduction of interconnect wire lengths and, ultimately, weight.

The door assembly 22 provides an enhanced means of thermal dissipation conducted through the printed circuit boards 74 into the frame 40. Further, the crimped profile 55 of the front panel 42 increases the surface area of the door assembly 22 as compared to an uncrimped profile. The increased surface area benefits the thermal exchange between the components attached to the door assembly 22 and heat loss through radiation or convection to the surrounding environment. Such thermal improvements are important for dealing with increased power densities allowing safe operation within the environment.

Further still, the door assembly 22 is low cost and has a low part count. The above described door assembly 22 further provides quick and easy access to internal and external elements of panel assembly 20, 20a, as well as environmental protection for internal parts. The door assembly 22 also provides structural and thermal advantages with a minimal number of components and assembly functions.

The door assembly 22 of the power management panel 20, 20a supports additional electrical components allowing for a compact system of high density of interfaces within a specified volume. A plug-in technology for circuit breaker 76 and interconnecting relays can be used, which improves both power to volume and power to weight ratios for a given power management panel 20, 20a. Aspects of the present disclosure allow for a variety of benefits including but not limited to allowing for quick and easy access to the internal and external elements of the power management panel assembly for maintenance purposes. Aspects of the present disclosure also provide for protection for exposed circuit breaker protrusions 86, and provide area for indicia 88 identifying each circuit breaker 84 during operation. Furthermore, the ridges 56 protect the electric components from environment aspects such as moisture ingress.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power management panel, comprising:
an avionics power management cabinet comprising a set of walls at least partially defining an interior with an open face; and
at least one door assembly configured to mount electrical components for the power management panel, moveably mounted to the avionics power management cabinet and moveable between an opened position, where the interior is accessible, and a closed position where the door assembly closes the open face, and having a front panel that includes a set of rows with apertures formed between two adjacent rows and where the set of rows have a crimped profile with a ridge extending towards a front surface of the door assembly;
wherein the door assembly is configured to support circuit breakers, printed circuit boards, or electrical relays.

2. The power management panel of claim 1, wherein the ridge has an angled upper surface.

3. The power management panel of claim 1, further comprising at least one printed circuit board mounted to the door assembly.

4. The power management panel of claim 3, further comprising a frame at least partially surrounding the front panel and wherein the frame is moveably mounted to the avionics power management cabinet.

5. The power management panel of claim 4, wherein the at least one printed circuit board is mounted to a rear surface of the frame.

6. The power management panel of claim 5, wherein the frame includes a first side section, a second side section, a top section, and a bottom section where the first side section, the second side section, the top section, and the bottom section include a common extrusion profile.

7. The power management panel of claim 1, further comprising at least one printed circuit board and wherein the printed circuit board extends over two or more rows.

8. The power management panel of claim 7, further comprising a set of pillar spacers coupled to the front panel and configured to support the at least one printed circuit board.

9. The power management panel of claim 8, further comprising a plate mounted between two adjacent rows and wherein one pillar spacer of the set of pillar spacers is suspended from the plate adjacent a corresponding aperture.

10. The power management panel of claim 1, wherein the front panel includes aluminum that is 1 mm thick.

11. The power management panel of claim 10, wherein the door assembly is configured to support a weight in excess of 11.34 kg.

12. A door assembly, comprising:
a central section that includes a set of rows with apertures formed between two adjacent rows and where the set of rows have a crimped profile with a ridge extending towards a front surface of the door assembly;
a frame at least partially surrounding the central section; and
a printed circuit board mounted to a rear surface of the frame of the door assembly and wherein the printed circuit board extends over two or more rows;
wherein the door assembly is configured for an avionics power management panel.

13. The door assembly of claim 12, further comprising a set of pillar spacers coupled to the central section and configured to support the printed circuit board.

14. The door assembly of claim 13, further comprising a plate mounted between two adjacent rows and wherein one pillar spacer of the set of pillar spacers is suspended from the plate adjacent a corresponding aperture.

15. The door assembly of claim 12, further comprising a set of plug-in circuit breakers mounted from a front of the central section and passing through one aperture of the apertures in the central section, and wherein the set of plug-in circuit breakers are press fit into sockets within the printed circuit board.

16. The door assembly of claim 12, wherein the frame includes a first side section, a second side section, a top section, and a bottom section where the first side section, the second side section, the top section, and the bottom section include a common extrusion profile.

17. A door assembly, comprising:
a center section that includes a set of rows with apertures formed between two adjacent rows and where the set of rows have a crimped profile with a ridge extending a length towards a front surface of the door assembly;
at least one plug-in circuit breaker mounted within the apertures of the center section and wherein the at least one plug-in circuit breaker is contained within the length defined by the crimped profile; and
a cover plate with at least one opening configured to retain the at least one plug-in circuit breaker during operation;
wherein the door assembly is configured for an avionics power management panel.

* * * * *